(12) United States Patent
Rhyee et al.

(10) Patent No.: US 8,604,331 B2
(45) Date of Patent: Dec. 10, 2013

(54) THERMOELECTRIC MATERIAL, AND THERMOELECTRIC MODULE AND THERMOELECTRIC DEVICE INCLUDING THE THERMOELECTRIC MATERIAL

(75) Inventors: Jong-soo Rhyee, Suwon-si (KR); Sang-il Kim, Seoul (KR); Sang-mock Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 151 days.

(21) Appl. No.: 13/076,149

(22) Filed: Mar. 30, 2011

(65) Prior Publication Data
US 2011/0240081 A1  Oct. 6, 2011

(30) Foreign Application Priority Data
Mar. 31, 2010  (KR) .................. 10-2010-0029350

(51) Int. Cl.
*H01L 35/12* (2006.01)
*H01L 35/16* (2006.01)
*H01L 35/20* (2006.01)
*H01L 35/28* (2006.01)

(52) U.S. Cl.
USPC ......... 136/236.1; 136/203; 136/238; 136/241

(58) Field of Classification Search
USPC ...................................................... 136/236.1
See application file for complete search history.

(56) References Cited

U.S. PATENT DOCUMENTS 5,994,639 A * 11/1999 Johnson et al. ............ 136/236.1
6,225,550 B1 * 5/2001 Hornbostel et al. ....... 136/236.1
6,369,314 B1 * 4/2002 Nolas ............................ 136/201
7,371,960 B2 * 5/2008 He et al. .................... 136/236.1
2003/0056819 A1 * 3/2003 Imai et al. ...................... 136/239

FOREIGN PATENT DOCUMENTS

KR    10-0849030 A    4/2008
KR    1020080070791 A    7/2008
KR    1020090000829 A    1/2009

OTHER PUBLICATIONS

Esseni, D. et al., Theory of the motion at the band crossing points in bulk semiconductor crystals and in inversion layers, Journal of Applied Physics, 2009, vol. 105(5): 053702-053702-11.
Jong-Soo Rhyee et al., "Peierls distortion as a route to high thermoelectric performance in In4Se3-d crystals", Nature, vol. 459, Jun. 18, 2009, pp. 965-968.
K.Y. Shin et al., "Electronic structure and charge-density wave formation in LaTe1.95 and CeTe2.00", Physical Review B, 72, 2005, pp. 085132-1-085132-9.

* cited by examiner

*Primary Examiner* — Jennifer Michener
*Assistant Examiner* — Sadie White
(74) *Attorney, Agent, or Firm* — Cantor Colburn LLP

(57) ABSTRACT

A thermoelectric material includes a compound represented by Formula 1:

$$A_a R_b G_{3\pm n}$$  Formula 1 wherein component A includes at least one element selected from a Group 1 element, a Group 2 element, and a metal of Groups 3 to 12, component R is a rare-earth element, component G includes at least one element selected from sulfur (S), selenium (Se), tellurium (Te), phosphorus (P), arsenic (As), antimony (Sb), bismuth (Bi), carbon (C), silicon (Si), germanium (Ge), tin (Sn), boron (B), aluminum (Al), gallium (Ga), and indium (In), $0<a\leq 1$, $0<b\leq 1$, and $0\leq n<1$.

9 Claims, 9 Drawing Sheets

THERMOELECTRIC MATERIAL, AND THERMOELECTRIC MODULE AND THERMOELECTRIC DEVICE INCLUDING THE THERMOELECTRIC MATERIAL

CROSS-REFERENCE TO RELATED APPLICATIONS

This application claims the benefit of Korean Patent Application No. 10-2010-0029350, filed on Mar. 31, 2010, and all the benefits accruing therefrom under 35 U.S.C. §119, the content of which in its entirety is herein incorporated by reference.

BACKGROUND

1. Field

The present disclosure relates to a thermoelectric material having a high figure-of-merit, thermoelectric modules including the thermoelectric material, and thermoelectric devices including the thermoelectric modules, and more particularly, to a thermoelectric material having a large Seebeck coefficient, high electrical conductivity, and low thermal conductivity, thermoelectric modules including the thermoelectric material, and thermoelectric devices including the thermoelectric modules.

2. Description of the Related Art

In general, thermoelectric materials are used in active cooling and waste heat power generation based on the Peltier effect and the Seebeck effect. The Peltier effect is a phenomenon in which, as illustrated in FIG. 1, holes of a p-type material and electrons of an n-type material move when a direct current ("DC") voltage is applied to the p-type and n-type materials, and thus exothermic and endothermic reactions occur at opposite ends of each of the n-type and p-type materials. The Seebeck effect is a phenomenon in which, as illustrated in FIG. 2, holes and electrons move when heat is provided by an external heat source and causes electric current to flow in a material, thereby converting a temperature difference into electrical power.

Active cooling using a thermoelectric material improves the thermal stability of a device, does not produce vibration and noise, and does not require use of a separate condenser and refrigerant; thus is regarded as an environmentally friendly method of cooling. Active cooling using a thermoelectric material can be applied in refrigerant-free refrigerators, air conditioners, and various micro-cooling systems. In particular, if a thermoelectric device is attached to a memory device, the temperature of the memory device may be maintained at a uniform and stable level. Thus, use of thermoelectric devices in memory devices may contribute to higher performance.

In addition, when thermoelectric materials are used for thermoelectric power generation based on the Seebeck effect, waste heat is used as an energy source. Thus, the energy efficiency of a vehicle engine, an exhaust device, a waste incinerator, a steel mill, or a medical device power source which uses heat from a human body may be increased, or the waste heat can be collected for use in other applications.

The performance of the thermoelectric material is evaluated using a dimensionless figure-of-merit ZT defined by Equation 1.

$$ZT = \frac{S^2 \sigma T}{k} \quad \text{Equation 1}$$

In Equation 1, S is a Seebeck coefficient, σ is an electrical conductivity, T is an absolute temperature, and κ is a thermal conductivity.

To increase the ZT, a material having a large Seebeck coefficient, a high electrical conductivity, and a low thermal conductivity is desirable.

SUMMARY

Provided is a thermoelectric material having a large Seebeck coefficient, high electrical conductivity, and low thermal conductivity.

Provided is a thermoelectric module including a thermoelectric element including the thermoelectric material.

Provided is a thermoelectric device including the thermoelectric module.

Additional aspects, features, and advantages will be set forth in part in the description which follows and, in part, will be apparent from the description.

According to an aspect, a thermoelectric material may include a compound represented by Formula 1:

$$A_a R_b G_{3\pm n} \quad \text{Formula 1}$$

wherein component A includes at least one element selected from a Group 1 element, a Group 2 element, and a metal of Groups 3 to 12, component R is a rare-earth element, component G includes at least one element selected from sulfur (S), selenium (Se), tellurium (Te), phosphorus (P), arsenic (As), antimony (Sb), bismuth (Bi), carbon (C), silicon (Si), germanium (Ge), tin (Sn), boron (B), aluminum (Al), gallium (Ga), and indium (In), 0<a≤1, 0<b≤1, and 0≤n<1.

According to an embodiment, the compound represented by Formula 1 may have a two-dimensional layered structure.

According to an embodiment, the compound represented by Formula 1 may have a layered structure in which a block layer including component R and component G is interposed between double layers comprising of component G, and component A is intercalated between the double layer and the block layer or is substituted at the position of component R.

According to an embodiment, the compound represented by Formula 1 may have a lattice distortion formed by a charge density wave.

According to an embodiment, a is less than b.

According to an embodiment, a is greater than 0 and less than or equal to about 0.5.

According to an embodiment, the sum of a and b is equal to or greater than about 1 and less than or equal to about 1.5.

According to an embodiment, n is equal to or greater than 0 and less than or equal to about 0.5.

According to an embodiment, component G may include at least one element selected from sulfur (S), selenium (Se), and tellurium (Te).

According to an embodiment, component G may further include at least one element selected from phosphorous (P), arsenic (As), antimony (Sb), bismuth (Bi), carbon (C), silicon (Si), germanium (Ge), tin (Sn), boron (B), aluminum (Al), gallium (Ga), and indium (In).

According to an embodiment, component A may include at least one element selected from potassium (K), rubidium (Rb), magnesium (Mg), calcium (Ca), strontium (Sr), nickel (Ni), copper (Cu), zinc (Zn), silver (Ag), scandium (Sc), yttrium (Y), titanium (Ti), zirconium (Zr), hafnium (Hf), vanadium (V), niobium (Nb), tantalum (Ta), chromium (Cr), molybdenum (Mo), and tungsten (W).

According to an embodiment, component A may further include at least one element selected from manganese (Mn), iron (Fe), cobalt (Co), and rhenium (Re).

According to an embodiment, the compound represented by Formula 1 has a polycrystalline structure or a single crystalline structure.

According to another aspect, a thermoelectric module may include a first electrode, a second electrode, and a thermoelectric element interposed between the first electrode and the second electrode, wherein the thermoelectric element may include the thermoelectric material described above.

According to another aspect, a thermoelectric device may include: a heat source; and a thermoelectric module including a thermoelectric element, which absorbs heat from the heat source, a first electrode which contacts the thermoelectric element, and a second electrode, which faces the first electrode and contacts the thermoelectric element, wherein the thermoelectric element includes the thermoelectric material described above.

Also disclosed is a method of manufacturing a thermoelectric material, the method including: contacting a component A, a component R, and a component G to form a combination; and heat treating the combination to form the thermoelectric material, wherein the thermoelectric material is represented by Formula 1:

$$A_a R_b G_{3 \pm n} \qquad \text{Formula 1}$$

wherein component A includes at least one element selected from a Group 1 element, a Group 2 element, and a metal of Groups 3 to 12, component R is a rare-earth element, component G includes at least one element selected from sulfur, selenium, tellurium, phosphorus, arsenic, antimony, bismuth, carbon, silicon, germanium, tin, boron, aluminum, gallium, and indium, $0<a\leq1$, $0<b\leq1$, and $0\leq n<1$.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
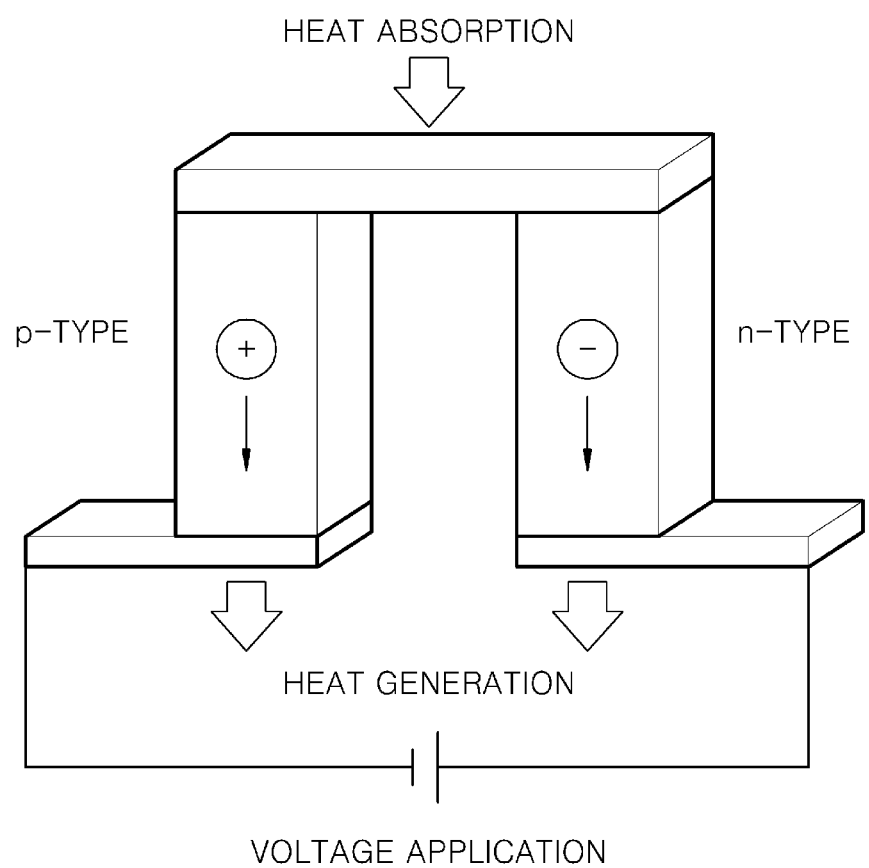
FIG. 1 is a schematic view illustrating an embodiment of thermoelectric cooling by the Peltier effect.

Reference will now be made in detail to embodiments, examples of which are illustrated in the accompanying drawings, wherein like reference numerals refer to the like elements throughout. In this regard, the present embodiments may have different forms and should not be construed as being limited to the descriptions set forth herein. Accordingly, the embodiments are merely described below, by referring to the figures, to explain aspects, features, and advantages of the present description.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms "first," "second," "third" etc. may be used herein to describe various elements, components, regions, layers and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Group" refers to a group of the periodic table of the elements according to the International Union of Pure and Applied Chemistry ("IUPAC") Groups 1-18 group classification system.

Hereinafter, embodiments will be disclosed in further detail.

In general, materials having a large Seebeck coefficient, high electrical conductivity, and low thermal conductivity κ are desirable to increase the dimensionless figure-of-merit ZT that is a factor for evaluating the performance of a thermoelectric material. The thermal conductivity κ consists of electrons' contribution $\kappa_{el}$ and phonons' contribution $\kappa_{ph}$, as shown in Equation 2, wherein phonons are a quantified lattice vibration, as described below. The electrons' contribution $\kappa_{el}$ to thermal conductivity is not independently controlled because the electrons' contribution $\kappa_{el}$ is proportional to electrical conductivity according to the Wiedemann-Frantz law. Accordingly, in order to decrease the total thermal conductivity, decreasing the phonon component of thermal conductivity may be considered.

$$\kappa = \kappa_{el} + \kappa_{ph}, \quad \kappa_{el} = L_0 \sigma T \qquad \text{Equation 2}$$

$$L_0 = \frac{1}{3}\left(\frac{\pi k_B}{e}\right)^2 = 2.4453 \times 10^{-8} W\Omega K^{-2}$$

In Equation 2, k is the thermal conductivity, $\kappa_{el}$ is the electron component of thermal conductivity, $\kappa_{ph}$ is the phonon component of thermal conductivity by phonons, $L_0$ is a Lorentz factor, σ is an electrical conductivity, and T is an absolute temperature.

In order to obtain a low thermal conductivity and a high power factor, an embodiment of a thermoelectric material comprises a compound represented by Formula 1, which has a two-dimensional layered structure having a strong bond comprising a bond with substantial covalent character in an in-plane direction and a weak bond comprising a bond with substantial ionic character or a van der Waals bond in a b-axis direction:

$$A_a R_b G_{3\pm n} \qquad \text{Formula 1}$$

wherein component A includes at least one element selected from a Group 1 element, a Group 2 element, and a metal of Groups 3 to 12, component R is a rare-earth element, component G includes at least one element selected from sulfur (S), selenium (Se), tellurium (Te), phosphorus (P), arsenic (As), antimony (Sb), bismuth (Bi), carbon (C), silicon (Si), germanium (Ge), tin (Sn), boron (B), aluminum (Al), gallium (Ga), and indium (In), 0<a≤1, 0<b≤1, and 0≤n<1.

In an embodiment, 0.1<a<0.9, 0.1<b<0.9, and 0≤n<0.9; or 0.2<a<0.8, 0.2<b<0.8, and 0≤n<0.8; or 0.3<a<0.9, 0.3<b<0.9, and 0≤n<0.7; or 0<a<0.9, 0<b<0.9, and 0<n<0.9; or 0.1<a<0.9, 0.1<b<0.9, and 0.1<n<0.9.

Figure 3:
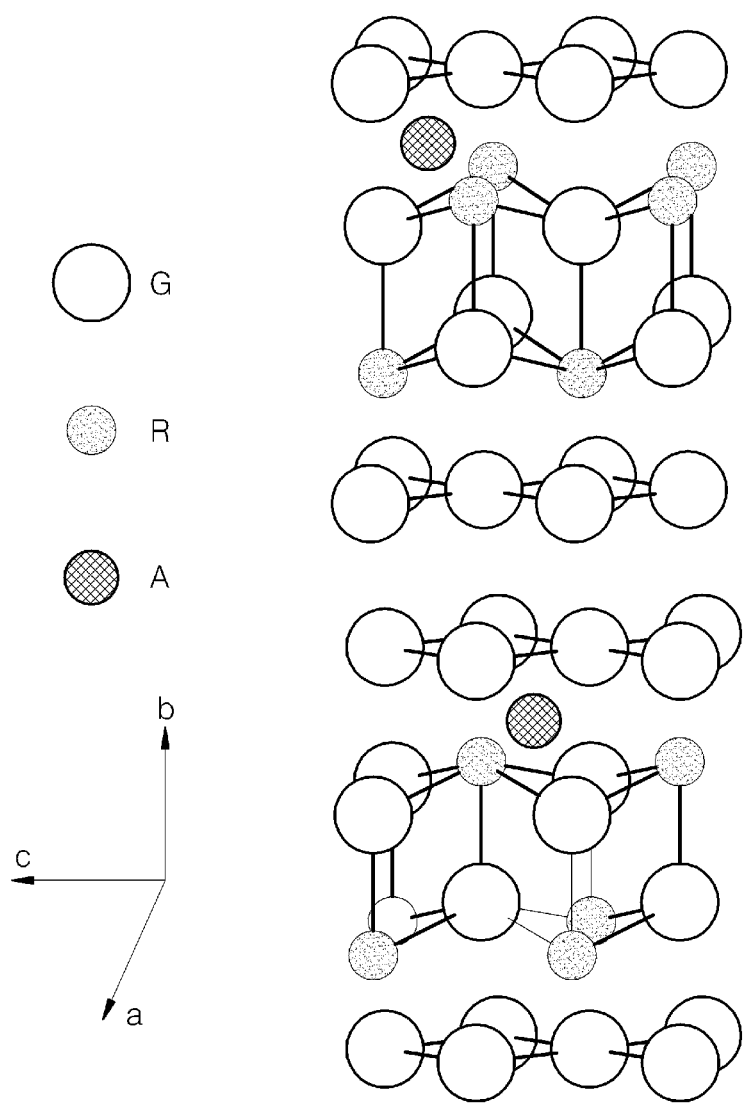
FIG. 3 is a schematic view of an embodiment of a crystal structure of a thermoelectric material.

As shown in FIG. 3, the thermoelectric material has a two-dimensional layered structure, and thus, shows two-dimensional, e.g., anisotropic, conducting characteristics. In addition, the thermoelectric material may have a two-dimensional or one-dimensional lattice distortion in an in-plane direction and an aligned structure in a b-axis direction. In an embodiment, the thermoelectric material comprises, consists essentially of, or consists of a layered structure in which a block layer composed of component R and component G is interposed between double layers composed of component G, and component A may be intercalated between the double layer and the block layer, or may be substituted at the position of component R in the block layer. In another embodiment, the thermoelectric material comprises, consists essentially of, or consists of a compound represented by Formula 1 comprising a layered structure in which a block layer comprising components R and G is interposed between double layers composed of component G, and component A is interposed between the first double layer and the block layer or is substituted at the position of component R in the block layer.

For example, in an embodiment, component A may be a chalcogenide compound comprising or consisting of a metal of Groups 3 to 12, component R may be a rare-earth element, and component G may be a chalcogen element having a high density energy states in the vicinity of a Fermi energy level because a f-electron of the rare-earth element of component R is localized to have an energy level near the Fermi energy level. In addition, the electrical conductivity is increased by increasing a hole density flowing within the chalcogenide layers by the doping and/or intercalation of component G. In addition, because a charge density wave is generated due to a strong interaction between an electron and the lattice, lattice thermal conductivity is reduced, and thus, the figure-of-merit is increased.

In addition, hybridization may occur between d and p orbitals of the metal of component A of Groups 3 to 12 and the rare-earth element of component R, and thus, an energy of the f-electron of the rare-earth element of component R is controlled, so as selected an f-electron energy band is located near a Fermi energy level. As a result, the thermoelectric material may have a high Seebeck coefficient. In addition, the doping and/or intercalating of component A between the component G double layer and the G-R block layer may increase the electrical conductivity of the thermoelectric material, and strengthen a bonding force in the b-axis direction, thereby increasing the mechanical strength of the thermoelectric material.

Due to the generation of a charge density wave, the control of a charge density by doping and/or intercalating component A, and the lattice distortion, the thermoelectric material may have an increased electrical conductivity and an increased Seebeck coefficient. In the compound represented by Formula 1, component A may be a Group 1 element, a Group 2 element, or a metal element of Groups 3 to 12. According to an embodiment, the Group 1 element may be at least one element selected from sodium (Na), potassium (K), and rubidium (Rb), the Group 2 element may be at least one element selected from magnesium (Mg), calcium (Ca), strontium (Sr), and barium (Ba), and the metal of Groups 3 to 12 may be at least one element selected from nickel (Ni), copper (Cu), zinc (Zn), silver (Ag), scandium (Sc), yttrium (Y), titanium (Ti), zirconium (Zr), hafnium (Hf), vanadium (V), niobium (Nb), tantalum (Ta), chromium (Cr), molybdenum (Mo), tungsten (W), manganese (Mn), iron (Fe), cobalt (Co), and rhenium (Re)

According to another embodiment, component A may include at least one element selected from Na, K, Rb, Mg, Ca, Sr, Ni, Cu, Zn, Ag, Sc, Y, Ti, Zr, Hf, V, Nb, Ta, Cr, Mo, and W. In addition, component A may further include at least one element selected from Mn, Fe, Co, and Re, together with the at least one element selected from Na, K, Rb, Mg, Ca, Sr, Ni, Cu, Zn, Ag, Sc, Y, Ti, Zr, Hf, V, Nb, Ta, Cr, Mo, and W.

In the compound represented by Formula 1, a mole ratio (a) of component A may be greater than about 0 and equal to or less than about 1, specifically greater than about 0 and equal to or less than about 0.5, or in the range of about 0.01 to about 0.2, specifically about 0.05 to about 0.15, more specifically about 0.1, based on one mole of the compound of Formula 1. Within this range, component A may not crystallize or may not precipitate at a grain boundary.

In addition, in the compound represented by Formula 1, the mole ratio (a) of component A may be less than the mole ratio (b) of the rare-earth element of component R. In addition, the sum of the mole ratios of components A and R, that is a+b, may be in the range of about 1 to about 1.5, specifically about 1.1 to about 1.4, more specifically about 1.2 to about 1.3.

In the compound represented by Formula 1, the rare-earth element of component R may be at least one element selected from yttrium (Y), cerium (Ce), and lanthanum (La). The compound represented by Formula 1 may include at least one type of rare-earth element, for example, Ce.

In the compound represented by Formula 1, component G may be, for example, at least one element selected from sulfur (S), selenium (Se), Tellurium (Te), phosphorous (P), arsenic (As), antimony (Sb), bismuth (Bi), carbon (C), silicon (Si), germanium (Ge), tin (Sn), boron (B), aluminum (Al), gallium (Ga), and indium (In).

According to an embodiment, component G may comprise a chalcogen element $G_1$, such as S, Se, or Te. Component G comprises $G_1$, component G may further comprise a second element $G_2$ comprising at least one element selected from P, As, Sb, Bi, C, Si, Ge, Sn, B, Al, Ga, and In. In this regard, the mole ratio of $G_1:G_2$ may be in the range of about 1:0 to about 0:1, specifically about 1:9 to about 9:1, more specifically about 1:0 to about 5:5.

When component G includes at least two types of elements, electrical conductivity and the Seebeck coefficient may be further increased. For example, when two-band conduction occurs, i.e. when an electron and a hole co-exist, only one of the electron and the hole may have conducting characteristics by substituting a portion of $G_1$ with $G_2$, thereby controlling a charge density of a thermoelectric material.

In the compound represented by Formula 1, the mole ratio of component G may be greater than about 2.0 moles ("mol") and less than about 4.0 mol, specifically, in the range of about 2.5 mol to about 3.5 mol, more specifically 3 mol, based on 1 mole of the compound of Formula 1.

According to an embodiment, the mole ratio of component G may be greater than about 2.0 mol and less than about 4.0 mol, specifically about 2.1 mol to about 3.9 mol, more specifically about 2.5 mol to about 3.5 mol, based on 1 mole of component R. For example, the mole ratio of component G may be greater than about 2.0 mol and equal to or less than about 3.0 mol, or in the range of about 2.5 mol to about 3.0 mol, based on 1 mole of component R. Alternatively, the mole ratio of component G may be equal to or greater than about 3.0 mol and less than about 4.0 mol, specifically about 3.0 mol to about 3.5 mol, more specifically about 3.0 mol to about 3.2 mol, based on 1 mole of component R. Alternatively, the mole ratio of component G may be greater than about 2.0 mol and less than about 4.0 mol, specifically about 2.1 mol to about 3.9 mol, more specifically about 2.5 mol to about 3.5 mol, based on 1 mole of the compound of Formula 1. Alternatively, the mole ratio of component G may be equal to or greater than about 3.0 mol and less than about 4.0 mol, specifically about 3.0 mol to about 3.5 mol, more specifically about 3.0 mol to about 3.2 mol, based on 1 mole of the compound of Formula 1.

When the mole ratio of component G is within the foregoing range, and while not wanting to be bound by theory, it is believed that because the layer of component G, which transports holes, is a double layer, electrons flowing in the R-G block layers and an electron-hole Seebeck coefficient offset effect are substantially or effectively prevented, thereby preventing a substantial decrease in the Seebeck coefficient and a change in the crystal structure.

As further disclosed above, and while not wanting to be bound by theory, it is believed that the thermoelectric material has a low thermal conductivity, and also comprises a lattice distortion of electrons which is understood to occur due to two-dimensional conductivity characteristics of the thermoelectric material. In addition, because the double layer comprising component G transports holes is a double layer, a material having a high electrical conductivity and a large Seebeck coefficient is provided.

Accordingly, a thermoelectric material has a large thermoelectric figure-of-merit ZT, specifically a large thermoelectric figure-of-merit at about 600 K or less, specifically, at about 550 K or less, more specifically at about 400 K or less. For example, the figure of merit ZT may be about 0.01 to about 0.5, specifically about 0.02 to about 0.3, more specifically about 0.03 to about 0.2 at a temperature of about 200 to about 700 K, specifically about 200 to about 400 K, more specifically about 250 to about 350 K.

According to an embodiment, the thermoelectric material including the compound represented by Formula 1 may have a thermal conductivity of about 3.5 watts per meter Kelvin (W/mK) or less, specifically about 3 W/mK or less, more specifically about 2.8 W/mK or less, or about 2.5 W/mK or less, at a temperature of about 200 to about 700 K, specifically about 200 to about 400 K, more specifically about 250 to about 350 K.

In addition, the thermoelectric material including the compound represented by Formula 1 may have a Seebeck coefficient of about 10 microvolts per Kelvin (µV/K) or more, specifically about 20 µV/K or more, more specifically about 30 µV/K or more, or about 40 µV/K or more, at a temperature of about 200 to about 700 K, specifically about 200 to about 400 K, more specifically about 250 to about 350 K.

In addition, the thermoelectric material including the compound represented by Formula 1 may have a power factor of about 0.05 milliwatts per meter Kelvin squared (mW/(mK$^2$)) or more, specifically about 0.1 mW/(mK$^2$) or more, more specifically about 0.2 mW/(mK$^2$) or more, or about 0.6 mW/(mK$^2$) or more, at a temperature of about 200 to about 700 K, specifically about 200 to about 400 K, more specifically about 250 to about 350 K.

In addition, the thermoelectric material including the compound represented by Formula 1 may have a figure-of-merit (ZT) of about 0.01 or more, specifically about 0.02 or more, more specifically about 0.04 or more, or about 0.07 or more, at a temperature of about 200 to about 700 K, specifically about 200 to about 400 K, more specifically about 250 to about 350 K.

The thermoelectric material may have a polycrystalline structure or a single crystalline structure.

Examples of a method suitable for synthesizing the thermoelectric material having a polycrystalline structure include:
  an ampoule method, in which source elements are loaded into a quartz or metal ampoule, then gas in the ampoule is evacuated, the ampoule is sealed, and the ampoule is heat-treated;
  an arc melting method in which source elements are loaded into a chamber and then melted using an arc discharge under an inert gas atmosphere; and
  a solid state reaction method, in which a source powder is, in a first method, sufficiently combined and then processed to obtain a hard product (e.g., a pellet) and then the obtained hard product is heat-treated, or in a second method, the combined powder is heat-treated, processed, and then sintered.

However, thermoelectric material including a polycrystalline structure may also be synthesized using other methods.

Examples of a method of synthesizing the thermoelectric material including a single crystalline structure include:
  a metal flux crystal growth method, in which source elements and an element that provides a condition under which the source elements sufficiently grow into a crystal at high temperature are loaded into a crucible and then heat-treated at a relatively high temperature;
  a Bridgeman crystal growth method, in which source elements are loaded into a crucible and then an end of the crucible is heated at high-temperature until source elements are melted, and then the high temperature region is slowly shifted, thereby locally melting the source elements until the entirety of the source elements are exposed to the high-temperature region;
  a zone melting crystal growth method, wherein source elements are formed in the shape of a seed rod and a feed rod and then a melting zone is slowly shifted upward to grow crystals; and
  a vapor transport crystal growth method, in which source materials are loaded into a lower portion of a quartz tube and then the lower portion of the quartz tube is heated while a top portion of the quartz tube is maintained at low temperature. Thus, in the vapor transport crystal growth method, as the source materials evaporate, a solid phase reaction occurs at a relatively low temperature, so that the source materials are grown into crystals.

The synthesizing may include heat treating at about 300 to about 1200° C., specifically 400 to about 1100° C., more specifically about 500 to about 1000° C., or at about 600 to about 900° C.

However, the thermoelectric material including a single crystalline structure may also be synthesized using other methods. Also, the thermoelectric material may be prepared using any of the methods described above.

In an embodiment, the thermoelectric material including a polycrystalline structure may be further treated with a densification process that provides an increase in electrical conductivity. Examples of a densification process include:
  a hot pressing method, in which powdered compounds are loaded into a mold having a predetermined shape and then molded at high temperature of, for example, about 300 to about 800° C., specifically 350 to about 750° C., more specifically about 400 to about 700° C., and under high pressure of, for example, about 30 to about 300 megaPascals (MPa), specifically about 40 to about 250 MPa, more specifically about 50 to about 200 MPa;
  a spark plasma sintering method, in which powdered compounds are sintered for a short period of time at a high voltage and/or current and under high pressure, for example, at current of about 50 to about 500 amperes (A), specifically about 60 to about 450 A, more specifically about 70 to about 400 A, under a pressure of about 30 to about 300 MPa, specifically about 40 to about 250 MPa, more specifically about 50 to about 200 MPa; and
  a hot pressing method, in which powders are press-molded by extrusion-sintering at high temperature, for example, at about 300 to about 700° C., specifically 350 to about 650° C., more specifically about 400 to about 600° C.

Due to the densification process, the thermoelectric materials may have a density of about 70 to about 100 percent (%), specifically about 75 to 99%, more specifically about 80 to about 98% of a theoretical density. The theoretical density is calculated by dividing a molecular weight by an atomic volume, wherein the atomic volume is determined using a lattice constant. For example, the thermoelectric materials may have a density of about 95 to about 100% of the theoretical density, and correspondingly thus may have an improved electrical conductivity.

A thermoelectric element may be obtained by molding the thermoelectric material, or for example by cutting the thermoelectric material. If the thermoelectric material has a single crystalline structure, the cutting direction of the thermoelectric material may be selected to be perpendicular to a growth direction of the thermoelectric material.

The thermoelectric element may be a p-type thermoelectric element or an n-type thermoelectric element. The thermoelectric element may comprise a thermoelectric composite structure having a selected shape, for example, a thermoelectric composite structure in the form of rectangular parallelepiped.

In an embodiment, the thermoelectric element may be connected to (e.g., directly on) an electrode and may generate a cooling effect when a current is applied thereto, and may generate power using heat from a device or by another temperature difference.

Figure 4:
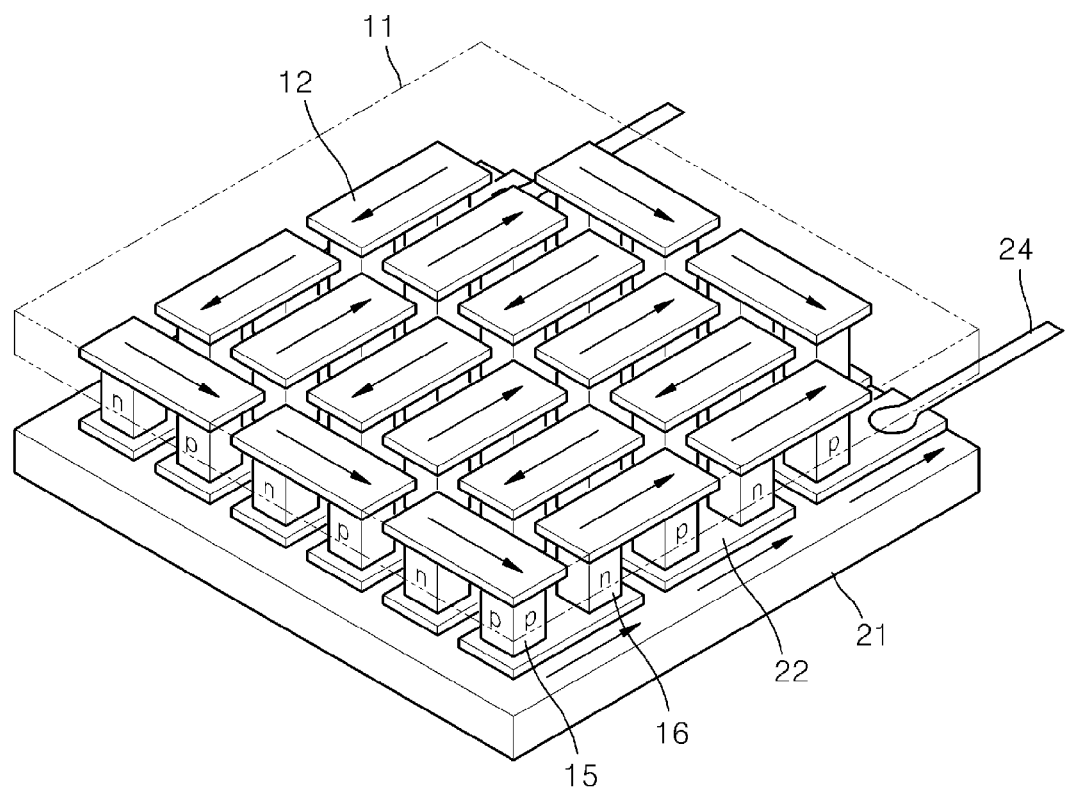
FIG. 4 is an exemplary embodiment of a thermoelectric module.

FIG. 4 is a perspective view of an embodiment of a thermoelectric module including the thermoelectric element. Referring to FIG. 4, a top electrode 12 and a bottom electrode 22 are disposed on (e.g., patterned on) a top insulating substrate 11 and a bottom insulating substrate 21, respectively, and the top electrode 12 and the bottom electrode 22 contact (e.g., electrically contact) a p-type thermoelectric element 15 and an n-type thermoelectric element 16, respectively. The top electrode 12 and the bottom electrode 22 are connected externally by a lead electrode 24.

The top and bottom insulating substrates 11 and 21 may comprise gallium arsenide (GaAs), sapphire, silicon, FIREX, or quartz. The top and bottom electrodes 12 and 22 may each independently comprise at least one element selected from aluminum, nickel, gold, and titanium, and may have various sizes. The top and bottom electrodes 12 and 22, respectively, may be formed with various known patterning methods, such as a lift-off semiconductor process, a deposition method, or a photolithography method.

Figure 2:
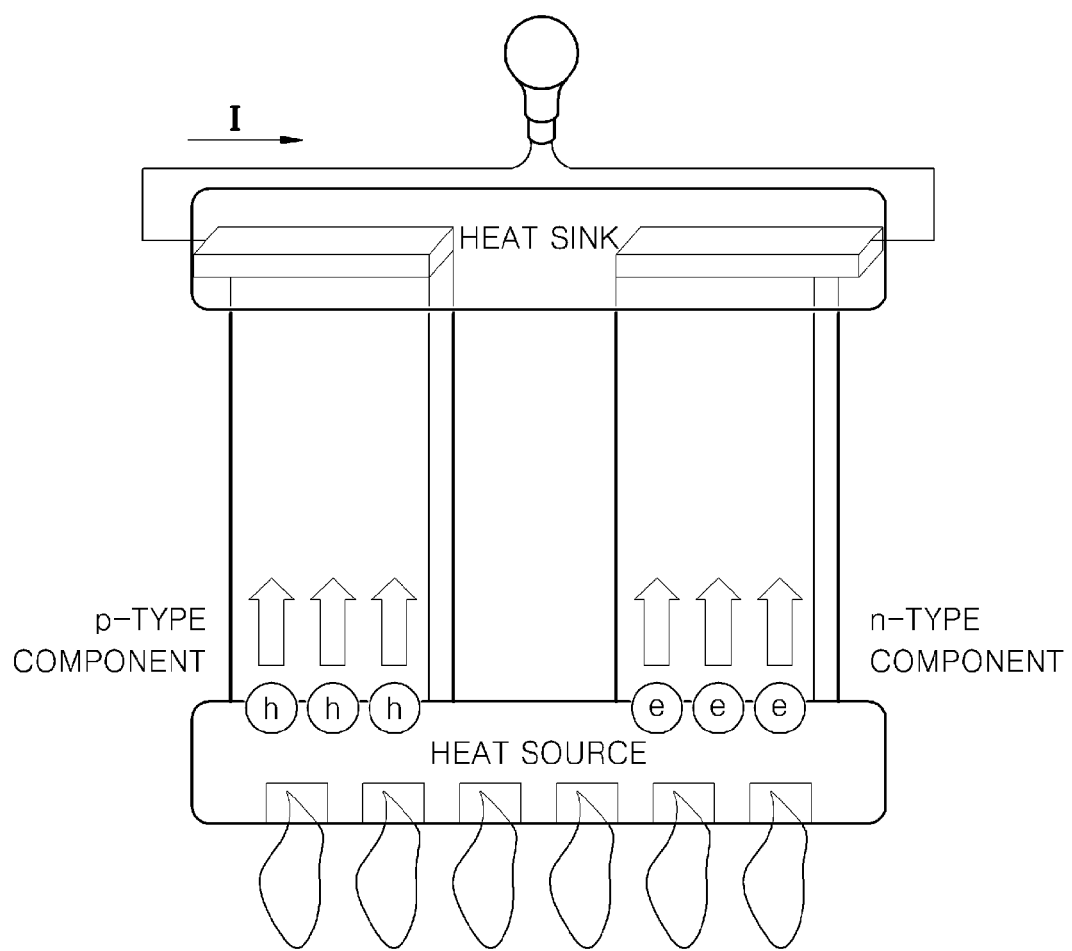
FIG. 2 is a schematic view illustrating an embodiment of thermoelectric power generation by the Seebeck effect.

A thermoelectric module according to another embodiment, as illustrated in FIGS. 1 and 2, comprises a first electrode, a second electrode, and a thermoelectric element, which comprises a thermoelectric material represented by Formula 1 and is interposed between the first and second electrodes. The thermoelectric element may be a p-type thermoelectric element 15 or an n-type thermoelectric element 16. The thermoelectric module may further include an insulating substrate, such a top insulating substrate 11 and a bottom insulating substrate 21, on which at least one electrode of the first electrode and the second electrode is located as illustrated in FIG. 4. The insulating substrate may be the same as described above.

In an embodiment of a thermoelectric module, one of the first electrode and the second electrode may be exposed to a heat source as illustrated in FIGS. 1 and 2. In an embodiment of a thermoelectric element, one of the first electrode and the second electrode may be electrically connected to a source of electric power as illustrated in FIG. 1. The source of electric power may be an electrical device that consumes or stores electric power, such as a battery, for example.

In a thermoelectric module, one of the first electrode and the second electrode may be electrically connected to a source of electric power as illustrated in FIG. 1.

In a thermoelectric module, a p-type thermoelectric element 15 and an n-type thermoelectric element 16 may be alternatively disposed as illustrated in FIG. 4, and at least one of the p-type thermoelectric element and the n-type thermoelectric element may include the thermoelectric material including the compound represented by Formula 1.

An embodiment of the thermoelectric device includes a heat source and the thermoelectric module, wherein the thermoelectric module includes a thermoelectric material which absorbs heat from a heat source and comprises the compound represented by Formula 1, a first electrode, and a second electrode, wherein the second electrode faces the first electrode. One of the first electrode and the second electrode may contact the thermoelectric material.

An example of the thermoelectric device may further include an electric power source electrically connected to the first electrode and the second electrode. Another example of the thermoelectric device may further include an electric power source electrically connected to one of the first electrode and the second electrode.

The thermoelectric material, the thermoelectric element, the thermoelectric module, and the thermoelectric device may each independently be used, for example, in a thermoelectric cooling system or in a thermoelectric power generation system. The thermoelectric cooling system may be a micro-cooling system, a cooling device for commercial or residential use, air conditioners, or a waste heat power generation system, but is not limited thereto. The structure and manufacturing method of the thermoelectric cooling system are well known in the art and thus, will not be described in detail herein.

An embodiment will be described in further detail with reference to the following examples. These examples are for illustrative purposes only and are not intended to limit the scope of the disclosed embodiment.

EXAMPLE 1

Ag, Ce, and Te in a mole ratio of 0.1:1:2.7 were placed into a quartz tube, and then the tube was evacuated and heat treated at a temperature of 850° C. for 24 hours, thereby synthesizing $Ag_{0.1}CeTe_{2.7}$. This synthesis process was also performed using Ni, Cu, and Zn instead of Ag, thereby respectively synthesizing $Ni_{0.1}CeTe_{2.7}$, $Cu_{0.1}CeTe_{2.7}$, and $Zn_{0.1}CeTe_{2.7}$.

The mole ratios of the synthesized compounds were determined by inductively coupled plasma spectroscopy.

EXPERIMENTAL EXAMPLE 1

Evaluation of Thermal Conductivity

Figure 5:
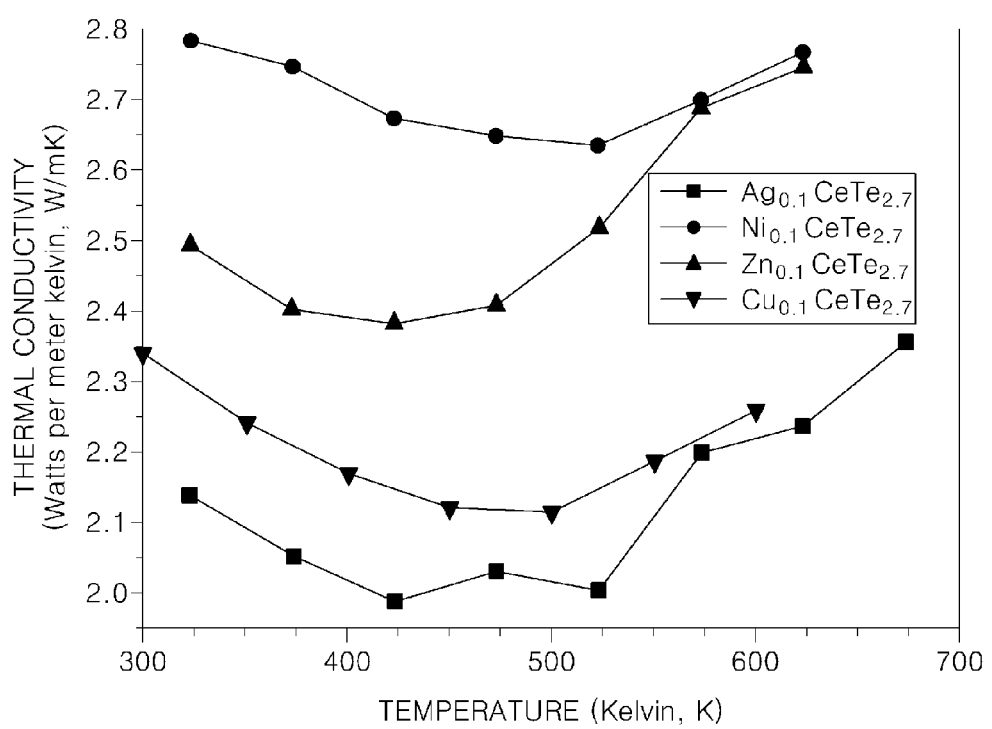
FIG. 5 is a graph of a thermal conductivity (watts per meter Kelvin, W/mK) versus temperature (Kelvin, K) of thermoelectric materials prepared according to Experimental Example 1.

Thermal conductivities of the thermoelectric materials $Ag_{0.1}CeTe_{2.7}$, $Ni_{0.1}CeTe_{2.7}$, $Cu_{0.1}CeTe_{2.7}$ and $Zn_{0.1}CeTe_{2.7}$ prepared according to Experimental Example 1 were measured, and the results are shown in FIG. 5. The thermal conductivities of the thermoelectric materials were about 3 W/mK or less, for example, in the range of about 2.0 to about 2.8 W/mK. In this regard, the thermal conductivities were obtained by evaluating thermal diffusivity measured using a laser flash method.

The crystal structure of the thermoelectric material is illustrated in FIG. 3. In an embodiment of the thermoelectric material, a Ce—Te block is interposed between Te-double layers. While not wanting to be bound by theory, it is believed that a strong covalent bond is formed in an (a-c)-direction, that is, in an in-plane direction, and a weak bond or van der Waals interaction is formed in a b-axis direction. The anisotropic characteristics of the crystal bonding forces are understood to greatly contribute to the lower thermal conductivity of the thermoelectric material.

EXPERIMENTAL EXAMPLE 2

Evaluation of Seebeck Coefficient

Figure 6:
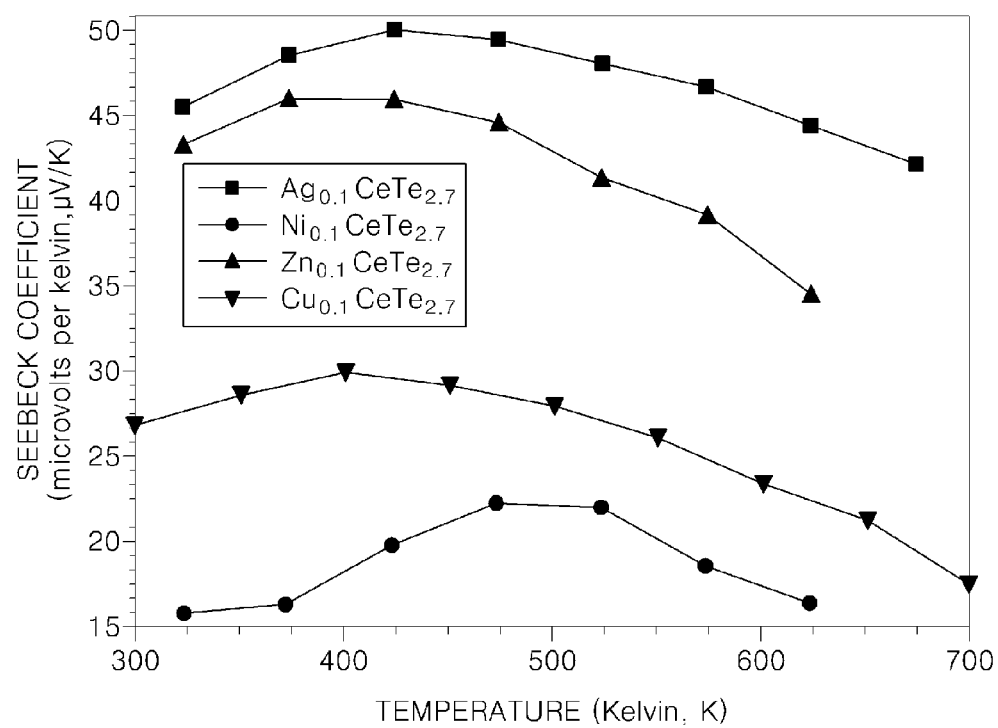
FIG. 6 is a graph of a Seebeck coefficient (microvolts per Kelvin, mV/K) versus temperature (Kelvin, K) of thermoelectric materials prepared according to Experimental Example 1.

Seebeck coefficients of the thermoelectric materials $Ag_{0.1}CeTe_{2.7}$, $Ni_{0.1}CeTe_{2.7}$, $Cu_{0.1}CeTe_{2.7}$ and $Zn_{0.1}CeTe_{2.7}$ prepared according to Experimental Example 1 were measured, and the results are shown in FIG. 6. The Seebeck coefficients were measured using a 4-terminal method.

For a chalcogenide compound that constitutes the thermoelectric material, the Seebeck coefficient is understood to be increased by the localized f-band controlled by dp-hybridization. Seebeck coefficients of the thermoelectric materials prepared according to Experimental Example 1 were about 10 μV/K or more at the temperatures indicated in FIG. 6, and were, for example, about 20 μV/K or more, or about 40 μV/K or more.

EXPERIMENTAL EXAMPLE 3

Evaluation of Electrical Conductivity

Figure 7:
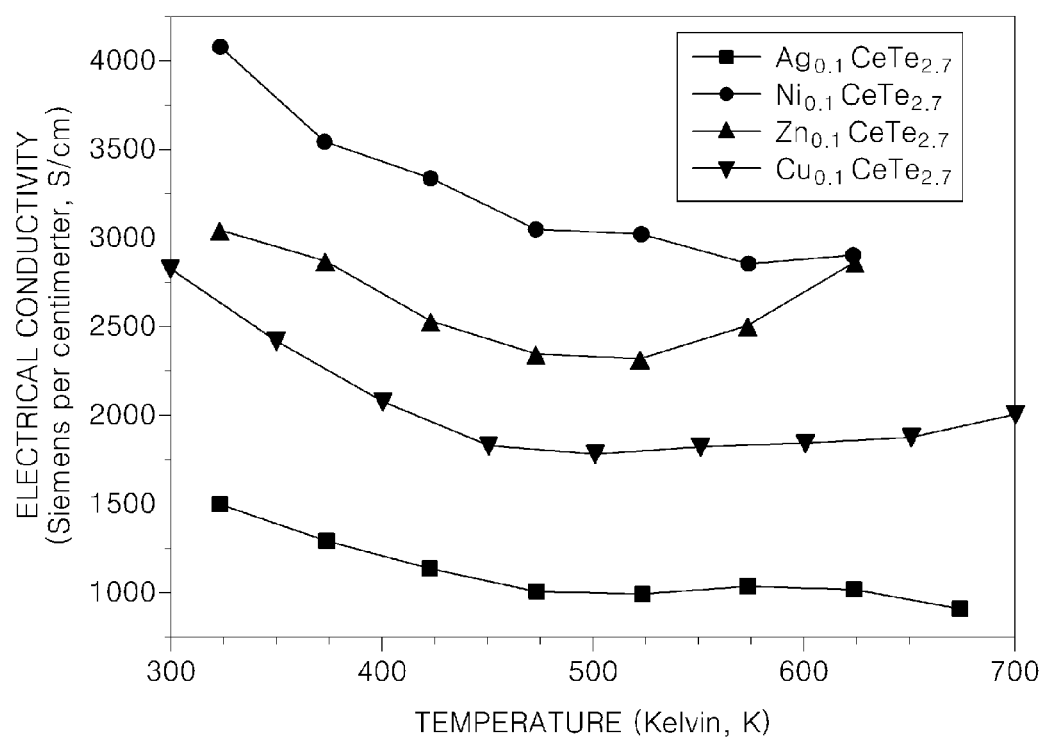
FIG. 7 is a graph of an electrical conductivity (siemens per centimeter, S/cm) versus temperature (Kelvin, K) of thermoelectric materials prepared according to Experimental Example 1.

Electrical conductivities of the thermoelectric materials $Ag_{0.1}CeTe_{2.7}$, $Ni_{0.1}CeTe_{2.7}$, $Cu_{0.1}CeTe_{2.7}$ and $Zn_{0.1}CeTe_{2.7}$ prepared according to Experimental Example 1 were measured, and the results are shown in FIG. 7. In this regard, the electrical conductivities were measured by using a 4-terminal method.

For a chalcogenide compound that constitutes the thermoelectric material, the electrical conductivity is increased by increasing a hole density flowing within chalcogenide layers by the doping and/or intercalation of component G.

As illustrated in FIG. 7, the electrical conductivity is higher at room temperature than at high temperature (e.g., at about 600 K or more), and is about 1000 to about 4000 siemens per centimeter (S/cm).

EXPERIMENTAL EXAMPLE 4

Calculation of Figure-of-Merit (ZT)

Figure 8:
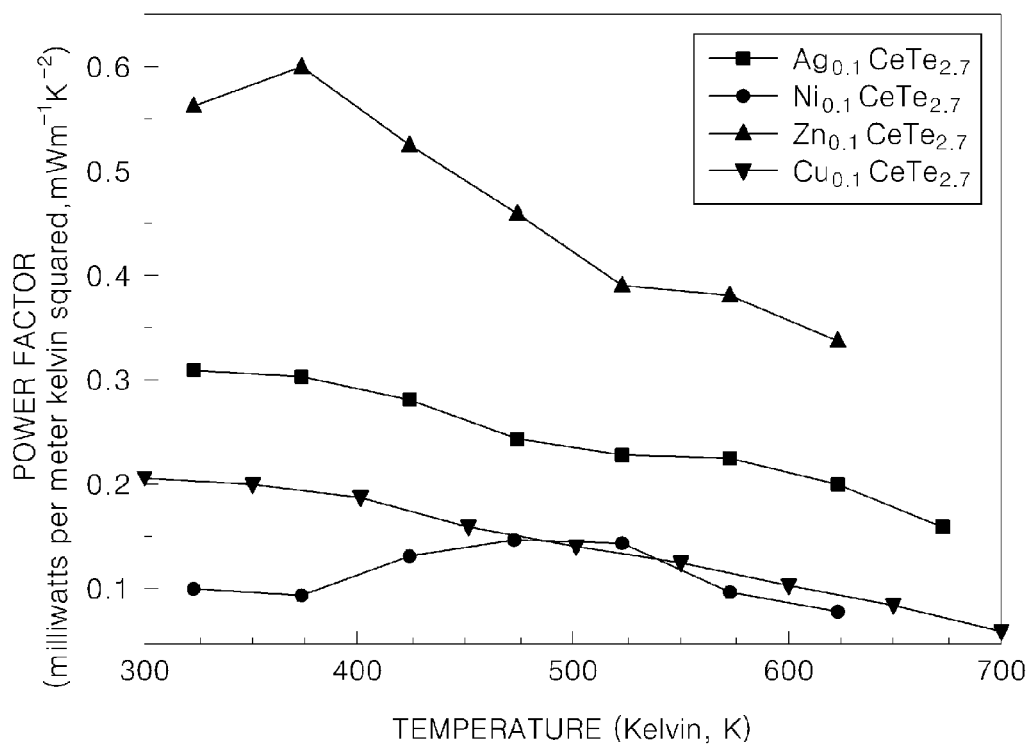
FIG. 8 is a graph of a power factor (milliwatts per meter Kelvin squared, $mWm^{-1}K^{-2}$) of thermoelectric materials prepared according to Experimental Example 1.

Power factors of the thermoelectric materials $Ag_{0.1}CeTe_{2.7}$, $Ni_{0.1}CeTe_{2.7}$, $Cu_{0.1}CeTe_{2.7}$ and $Zn_{0.1}CeTe_{2.7}$ prepared according to Experimental Example 1 were calculated using the results obtained according to Experimental Examples 1 to 3, and the results are shown in FIG. 8.

Figure 9:
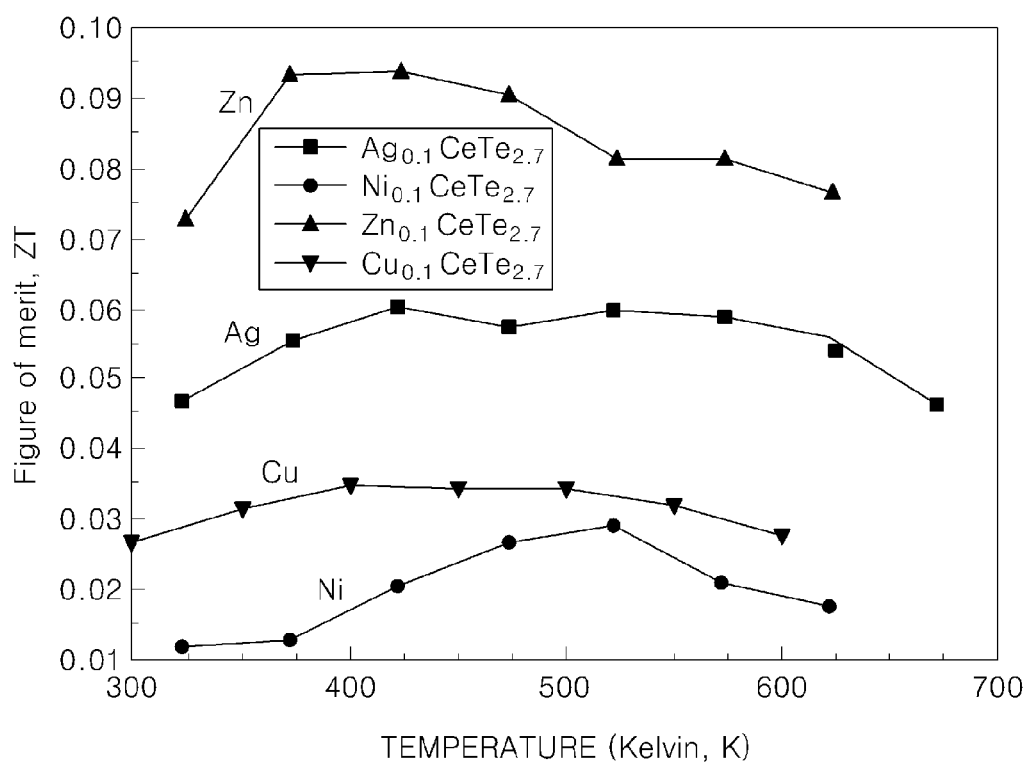
FIG. 9 is a graph of a figure-of-merit ZT (dimensionless) versus temperature (Kelvin, K) of thermoelectric materials prepared according to Experimental Example 1.

Due to high electrical conductivity, as illustrated in FIG. 8, the power factors are as high as about 0.05 mW/(mK$^2$) or more, for example, in the range of about 0.1 to about 0.6 mW/(mK$^2$). The value of ZT is, as illustrated in FIG. 9, about 0.01 or more, for example, about 0.04 or more, or about 0.07 or more, for example, about 0.09, at room temperature.

Thermoelectric materials according to an embodiment have a large Seebeck coefficient, high electrical conductivity, and low thermal conductivity, and thus provide high thermoelectric performance. Accordingly, the thermoelectric material may be useful for non-refrigerant refrigerators, air conditioners, waste heat power generation systems, thermoelectric nuclear power generation for military and aerospace purposes, and micro-cooling systems.

It should be understood that the exemplary embodiments described therein should be considered in a descriptive sense only and not for purposes of limitation. Descriptions of features or aspects within each embodiment should be considered as available for other similar features or aspects in other embodiments.

What is claimed is:

1. A thermoelectric material comprising a compound represented by Formula 1:

$$A_aR_bG_{3\pm n} \qquad \text{Formula 1}$$

wherein
component A comprises at least one element selected from Ag, Ni, Cu, and Zn,
component R is at least one element selected from yttrium, cerium, and lanthanum,
component G comprises tellurium,
a is 0.1,
b is 1, and
0≤n<1,
wherein the compound represented by Formula 1 comprises a layered structure comprising
a block layer comprising components R and G, and
a double layer on the block layer, the double layer consisting of directly adjacent sub-layers wherein each sub-layer consists of component G, and wherein component A is intercalated between the double layer and the block layer or is substituted at a position of component R in the block layer.

2. The thermoelectric material of claim 1, wherein the compound represented by Formula 1 has a lattice distortion formed by a charge density wave.

3. The thermoelectric material of claim 1, wherein n is equal to or greater than 0 and less than or equal to 0.5.

4. The thermoelectric material of claim 1, wherein component A further comprises at least one element selected from manganese, iron, cobalt, and rhenium.

5. The thermoelectric material of claim 1, wherein the compound represented by Formula 1 has a polycrystalline structure or a single crystalline structure.

6. A thermoelectric module comprising:
a first electrode,
a second electrode, and
a thermoelectric element interposed between the first electrode and the second electrode,
wherein the thermoelectric element comprises the thermoelectric material of claim 1.

7. A thermoelectric device comprising:
a heat source; and
a thermoelectric module comprising
a thermoelectric element, which absorbs heat from the heat source,
a first electrode which contacts the thermoelectric element, and
a second electrode, which faces the first electrode and contacts the thermoelectric element,
wherein the thermoelectric element comprises the thermoelectric material of claim 1.

8. The thermoelectric material of claim 1, wherein
R is cerium, and
G is tellurium.

9. The thermoelectric material of claim 8, wherein the compound represented by Formula 1 is at least one selected from $Ag_{0.1}CeTe_{2.7}$, $Ni_{0.1}CeTe_{2.7}$, $Cu_{0.1}CeTe_{2.7}$, and $Zn_{0.1}CeTe_{2.7}$.

* * * * *